US005491028A

United States Patent [19]
Sarin et al.

[11] Patent Number: 5,491,028
[45] Date of Patent: Feb. 13, 1996

[54] ENHANCED ADHERENCE OF DIAMOND COATINGS

[75] Inventors: Vinod K. Sarin, Lexington; Shish P. S. Arya, Allston, both of Mass.

[73] Assignee: Trustees of Boston University, Boston, Mass.

[21] Appl. No.: 423,998

[22] Filed: Apr. 18, 1995

Related U.S. Application Data

[62] Division of Ser. No. 64,556, May 21, 1993, Pat. No. 5,433,977.

[51] Int. Cl.$^6$ .................................................. C23C 16/26
[52] U.S. Cl. .................... 428/408; 428/697; 428/698; 428/699; 51/295; 51/307; 51/309; 423/446
[58] Field of Search .................... 428/408, 697, 428/698, 699; 51/295, 307, 309; 423/446

[56] References Cited

U.S. PATENT DOCUMENTS

| | | | |
|---|---|---|---|
| 4,767,608 | 8/1988 | Matsumoto et al. | 423/446 |
| 4,915,977 | 4/1990 | Okamoto et al. | 427/37 |
| 4,938,940 | 7/1990 | Hirose et al. | 423/446 |
| 5,075,096 | 12/1991 | Tanabe et al. | 423/446 |
| 5,110,405 | 5/1992 | Sawabe et al. | 156/610 |
| 5,135,730 | 8/1992 | Suzuki et al. | 423/446 |

OTHER PUBLICATIONS

"The Synthesis of High Quality Diamond in Combustion Flame", Yoichi Hirose et al, *Proc. 1st Int. Symp. on Diamond and Diamond Like Films* (The Electrochemical Society, Inc., Pennington, NJ, 1989, pp. 80–02.
"Synthesis of Diamond Film by ARC Discharge Plasma CVD", Naoto Ohtake et al, *Electrical Chemical Society Journal*, vol. 12, 1989, pp. 93–105.
"Low Pressure, Metastable Growth of Diamond and Diamondlike Phases", John C. Angus et al, *Science (Articles)*, Aug. 19, 1988, pp. 913–919.

*Primary Examiner*—A. A. Turner
*Attorney, Agent, or Firm*—Baker & Botts

[57] ABSTRACT

This invention is directed to the creation of diamond coatings with enhanced adherence on substrates, such as tungsten carbide-cobalt (WC—Co), by chemical vapor deposition. This process comprises the steps of creating a combustion flame, supplying a deposition promoter to the flame, positioning a substrate into the flame, and forming the diamond deposit with enhanced adherence on the substrate. The invention is also directed to methods for the formation of a diamond deposit with enhanced adherence by the addition of a high-temperature binder such as a refractory metal or an organometallic compound. Once incorporated, the high-temperature binder acts as a cement which increase the strength and adhesion of the coating to the substrate.

19 Claims, 8 Drawing Sheets

├── 25 μm ──┤

├── 5 μm ──┤

25 µm

5 µm

>5 Kg

60 Kg

ENHANCED ADHERENCE OF DIAMOND COATINGS

This application is a division of application Ser. No. 08/064,556, filed May 21, 1993, now U.S. Pat. No. 5,433,977.

BACKGROUND OF THE INVENTION

1. Field of the Invention

This invention relates to methods for the synthesis of diamond and diamond-containing coatings on substrates by chemical vapor deposition (CVD) and to the resulting coated substrates. These coatings have superior adhesion to the substrate and are useful in many industrial applications.

2. Description of the Background

Crystalline diamond is one of the most remarkable substances ever discovered. It has the highest atom number density of any of the terrestrial materials and is harder than any other solid, strongly resistant to abrasive wear, chemical wear, thermal shock, and degradation. The diamond also has the lowest compressibility and the highest thermal conductivity, nearly four times that of copper. Classically, the term diamond is reserved for crystalline cubic carbon. The cubic structure or lattice of the carbon atoms of the diamond is derived from a visualization of the saturated six member ring structure in layers, stacked and residing in a (111) coordination. A lattice with hexagonal symmetry is referred to as Lonsdaleite. Both cubic and hexagonal carbon lattices are comprised entirely of $sp^3$ tetrahedrally coordinated carbon. Compounds containing significant amounts of $sp^2$ trigonally coordinated carbon atoms are technically not diamond, but diamond-like phases. The term diamond as used herein will not carry this distinction, but is used to refer to both the true diamond and the diamond-like forms of carbon.

Diamonds have become indispensable in industrial applications and the present sources of natural diamond do not equal existing demands. These demands are currently being met with synthetic diamonds. In the early 1900's there were a number of fairly credible reports of the synthesis of diamonds. Today these reports are generally discounted as either fanciful or just plain wrong. It was not until 1955 that the methods used to produce synthetic diamonds were first published (H. Liander, ASEA J1. 28:97–98, 1955; F. P. Bundy et al., Nature 176:51–55, 1955). These researchers used a carbon solvent/catalyst to break the so-called graphite-diamond equilibrium line, which separates the two major atomic forms of the carbon atom, and formed $sp^3$ hybridized diamond from $sp^2$ hybridized graphite. Their methods required sustained temperatures of greater than 1600 K and sustained pressures of greater than 60 kbar (6.0 GPa). Although the synthetic diamonds created were crude compared to their natural counterparts, these researchers demonstrated that the process was possible and took the subject matter out of the sphere of alchemy and into the modem world and opened a whole new field of technology.

Presently, over 90% of the worldwide demand for industrial diamonds is met by synthetic diamonds. There is hardly a production facility in modem industry that does not directly or indirectly require the synthetic diamond. Some of its most common uses are as optical windows for infrared and visible transmissions, as wear resistant super-hard cutting tools, as super-sharp edges in medical applications, as abrasive, grinding materials and all tribological applications, as sliding materials, and as thin films for high temperature, high power semiconductor devices. As might be expected, the number and variety of uses to which synthetic diamonds are being applied is increasing and the demand is growing exponentially.

The diamond is a crystal like any other and the basic principles of crystal growth apply to its synthesis. Growth is limited by the basic thermodynamic variables of temperature, pressure and composition. The method selected for diamond growth depends upon what type of diamond is desired. Although there are as many different crystal structures as can be imagined, there are two basic types of diamond crystals, perfect or nearly perfect (Saw diamond abrasive (SDA)) and imperfect (Resinoid diamond abrasive (RDA)). The conventional method of diamond synthesis uses a carbonaceous material, usually graphite, which is mixed and compacted with a suitable solvent such as nickel, cobalt, or iron. The mixture is compressed to over 60 kbars in a reaction vessel and heated to above the eutectic melting point of the solvent. When this point is reached, diamond crystals begin to grow and eventually precipitate from the solution. The is the so-called high-pressure, high-temperature (HPHT) method of diamond synthesis.

The actual molecular processes which provide diamond growth are largely unknown as are the identities of all of the molecular species involved, but a few observation can be made. There is a large activation energy barrier between the two phases of carbon, graphite and diamond. Because the molar entropy of graphite is greater than that of diamond, the thermodynamic instability of the diamond increases with increasing temperatures. Consequently, increasing temperatures require creasing pressure to bring graphite and diamond into equilibrium. In all synthetic methods, increased temperatures are required solely for kinetic purposes. In high pressure diamond synthesis, molten carbon must be produced to create the high diffusion rates necessary to, achieve crystal growth.

The conventional HPHT method of diamond synthesis is slow, arduous, and very expensive requiring a great deal of expertise and dedicated bulky machinery. Intensive efforts around the world have been aimed at developing cheaper and more useful forms of synthetic diamond and particularly diamond film. Diamond films impart all of the advantageous properties of diamonds such as increased abrasive and chemical wear resistance, thermal shock resistance, and resistance to degradation, to a substrate. The advantages are clearly enormous. The principle difficulties have been encountered in determining how best to attach and secure the film to the substrate. Over the past twenty years, significant progress has been made in growing diamond film by chemical vapor deposition (CVD). This method overcomes the need for extremely high pressures and the associated bulk and expense of the apparatus required to achieve these pressures. Further, the scope of materials which can be coated with diamond has been greatly expanded. Potential substrate materials are no longer required to withstand the enormous temperatures and pressures of the HPHT process.

The basic CVD process involves the introduction of one or more gasses into a reaction vessel or chamber. To the chamber is added sufficient energy to excite the gasses and raise the energy level of the individual gas molecules. As the energy level rises, some of the molecules ionize. At the substrate surface, large numbers of free radicals form and there is a high degree of atomic mobility which is necessary to achieve diamond growth. As the energy level falls, precursor carbon molecules enter a metastable state forming a diamond-like lattice structure which deposits on the nearest surface. The metastable state refers to the stable formation of diamond structures within the graphite stabilization region of the carbon temperature/pressure stabilogram. The metastable phase depends on selected conditions including the types of gasses and deposition surfaces, the ratio of gasses in the mixture, the presence of contaminants or additives, and the temperatures of the substrate and of the reaction. It is believed that, at least in part, metastable phases form from high energy diamond precursor molecules which become quenched upon reacting with the substrate. Metastable phases form from precursor molecules with high chemical potential which accounts for the need for a hydrocarbon source. Some of the more useful hydrocarbon sources are acetylene, allylene, ethane, isobutane, isobutylene, pentane, trimethylene, isopentane, propylene, butane, methane, ethylene, and propane.

There are a number of different CVD techniques, which are categorized by the particular methods in which the source gas is decomposed or, in other words, the hydrocarbon molecules are raised to a higher energy level, Although there are various combinations and modifications, the basic CVD techniques are, hot filament CVD, generally described in U.S. Pat. No. 4,938,940, microwave plasma CVD, generally described in U.S. Pat. No. 4,767,608, electric discharge plasma CVD, generally described in U.S. Pat. No. 5,110,405, and combustion flame CVD, generally described in U.S. Pat. No. 5,135,730. The disclosures of these U.S. patents are hereby specifically incorporated by reference.

In hot filament CVD, a mixture of hydrocarbon and hydrogen gasses are passed over a tungsten filament or foil in a reaction chamber. To the chamber is added a substrate such as graphite. The filament is energized and the gasses ignited heating the substrate to between 600–1200K. The oxygen/acetylene ratio (R) is preferably between 0.75 and 1.2. Reaction pressure is selected from the range of 60 to 760 Torr. The dissociation products at these temperatures and pressures consist mainly of the radical species C, $C_2$, CH, $CH_2$, $CH_3$, and atomic hydrogen, as well as unreacted gasses. Deposition rates, which are rather slow, may be related to the enhanced recombination rate of atomic hydrogen or other radicals. Filaments are placed within about one centimeter of the substrate surface to minimize thermolization and recombination between radicals.

Although one of the more well investigated methods hot filament CVD does have drawbacks. Radiation heating of the substrate can produce excessive surface temperatures and more importantly, non-uniform surface temperatures. With excessive substrate temperatures, carbon radicals fail to form on the surface. With low surface temperatures, carbon fails to deposit on the substrate in any form. Consequently, with a non-uniform temperature distribution across the substrate surface carbon deposition is uneven and the resulting film quality is poor. Additionally, as with all methods which require an enclosed chamber, substrate size is limited to chamber size.

In microwave CVD, initial nucleation rates are high in comparison to filament-type CVD methods which allows for lower substrate temperatures. As before, a reaction chamber is required and into the chamber is injected a mixture of hydrocarbon and hydrogen gasses. To these gasses is applied a microwave or other high-frequency discharge to raise the molecules to a higher energy state. In the resulting plasma are growth nuclei such as diamond or inorganic powders. As the energy level falls to achieve the metastable state, diamond crystals form on the particles. Using this method, substrate surface temperatures as low as 823K have been reported (A. Sarabe ad T. Inuzuka, Appl. Phys. Lett. 46:146, 1985). This method is highly reproducible and most useful for the creation of single-crystal diamonds. However, there is little to no binding between individual diamond particles and as with most forms of CVD, substrate size, is limited to chamber size.

Diamond growth has also been reported using DC discharge between an anode and a cathode. In this method, inorganic crystals are placed into a reaction chamber containing an anode, a cathode, and a reaction gas including at least one organic compound. A direct current discharge between the two electrodes produces a plasma heating the; chamber to between 800° and 1100° C. The inorganic crystals which may be made from silicon carbide or boron nitride are vibrated and single crystal diamond is deposited on the particles. Although growth rates are high there are numerous drawbacks. First, the DC discharge produces a bombardment of ions, electrons, and neutral gas particles with large amounts of energy. In order to withstand this bombardment, the elements within the reaction chamber must be made of a refractory metal such as molybdenum. A filament is often required to start and/or maintain the DC discharge which must also be made of a chemically stable material such as tungsten. Both molybdenum and tungsten are quite expensive. Moreover, the entire reaction is performed in a vacuum at around $10^{-7}$ Torr which adds a level of complexity to every step of the entire process.

Each of these methods involve thermally controlled diamond synthesis wherein the temperature of the reaction is much higher than the temperature of the substrate. These higher reaction temperatures produce dissociation of the carbon source gas. However, the extent of dissociation and the gas phase chemistry are unique, making the role of particular excited states in each method nearly impossible to assess. Substrate temperature, although lower then reaction temperature, must still be sufficiently high to allow for mobility of surface molecules, particularly hydrogen for the saturation of carbon atoms. Also, elaborate apparatus made of expensive metals are typically required as is a reaction chamber to either maintain a vacuum, to provide a rarefied atmosphere of nobel gasses, or to totally eliminate certain compounds from the potential reactants. Moreover, these methods are more useful for the creation of single crystal diamond, not for the synthesis of diamond from. Adherence is not considered and intercrystal bonding does not take place to any significant degree.

In overcoming some of these problems, combustion flame CVD has proved to be a significant advancement. Using hydrocarbon gasses in the open air, sufficiently high temperatures are achieved to ionize precursor carbon molecules which fall into the metastable state as the energy dissipated and form diamond films on most any substrate. Combustion flame CVD starts from nearly equimolar mixtures of oxygen and usually acetylene although other hydrocarbon gasses have been tested. Oxygen is added directly or as an integral part of the hydrocarbon gas. Hydrogen gas prevents surface reconstruction and suppresses the formation of unsaturated carbon nuclei. Combustion temperatures of about 2500° C. to about 3000° C. have been achieved. Carbon is partially dissociated from the source gas at higher temperatures, but total ionization is not believed to be critical to the process. In the presence of atomic hydrogen, the diamond surfaces are likely to be saturated with hydrogen because H—H bond energy is greater then C—H bond energy. Also, atomic hydrogen suppress the formation of graphitic nuclei. The energy for these exothermic reactions is supplied by the energy added to dissociate hydrogen ($H_2 \rightarrow 2H$). Because of the dynamic interaction between atomic hydrogen and the diamond surface, there is a steady state concentration of free surface sites which is continually being replenished by carbon from the source gasses.

In general, cutting or welding torches have been useful in combustion flame synthesis. Gas flow is maintained to create a flame from a single outlet port. Flame size is adjusted by altering the flow of gasses to create a feather in the flame which is the area of incomplete combustion and the zone where diamond deposition occurs. Into this feather region is placed a substrate to be coated. The substrate temperature is maintained at a constant by altering its exact position in the flame and by forcing a cooling fluid past the opposite end of the substrate, which may be integral to the substrate support structure. Substrate surface temperature must be maintained between 300°–1200° C. and is preferably between 800°–900° C.

Diamond deposition is limited to a ball-like region on the substrate. At high carbon to oxygen ratios deposits with high amounts of amorphous carbon al found. At low carbon to oxygen ratios there is no carbon deposited due to complete oxidation of the components. When the carbon to oxygen ratio is set to about one, diamond films are observed over the entire deposition area. However, over this area, deposition is not uniform. At the edges, the density is non-uniform, decreasing at increasing distances from the deposition center. Generally the diamond crystals are well formed cubo-octahedrons of a high density and relatively free of pin holes. Consequently, although diamond films formed by combustion flame CVD are of a fairly high and consistent quality, strengths are low and deposition times are usually quite long.

SUMMARY OF THE INVENTION

The present invention overcomes the problems mad disadvantages associated with current strategies and designs and provides new methods for synthesizing diamond coatings on a substrate using chemical vapor deposition (CVD).

One embodiment of the invention is directed to, methods for producing a substrate coated with a strongly adherent, uniform layer of crystalline diamond particles of substantially uniform size and shape by combustion flame CVD. Combustion flame CVD comprises the steps of establishing a flow of oxygen and acetylene to a combustion device at a volumetric flow ratio ($R=O_2/C_2H_4$) of greater than or equal to about 1.0, creating a flame in the combustion device, wherein the flame comprises an inner core region, an acetylene feather region, and an outer region, positioning a substrate maintained at a temperature of between about 300° C. to about 1200° C. in the acetylene feather region, adding to the flame a deposition promoter in an amount sufficient to promote the growth of a strongly adherent, uniform layer of crystalline diamond particles on the substrate. The deposition promoter is selected from the group consisting of carboxylic acids, alcohols, aldehydes, ketones, ethers and carboxylic acid esters. These compounds may have between one and six carbon atoms. These materials have been found to promote the deposit of a strongly adherent, uniform layer of crystalline diamond particles of substantially uniform size and shape on said substrate.

Another embodiment of the invention is directed to a method for producing a substrate coated with a layer of crystalline diamond particles which is bonded to the substrate by combustion flame CVD. Combustion flame CVD comprises the steps of establishing a flow of oxygen and acetylene to a combustion device at a volumetric flow ratio $CR=O_2/C_2H_4$) of greater than or equal to about 1.0, creating a flame in the combustion device, wherein the flame comprising an inner core region, an acetylene feather region, and an outer region, positioning a substrate maintained at a temperature of between about 300° C. to about 1200° C. in the acetylene feather region, adding to the flame a high-temperature binder which is a refractory metal or an organometallic compound, and depositing a layer of crystalline diamond particles on the substrate which is bonded to the substrate by the high-temperature binder.

A yet another embodiment of the invention is directed toward methods for the synthesis of diamond coatings using both a deposition promoter and a high-temperature binder to produce strongly adherent, uniform layer of crystalline diamond particles on the substrate which is bonded to the substrate by the high-temperature binder. Combustion flame CVD methods are both useful and can be used to create the desired coatings.

A further embodiment of the invention is directed to an article which comprises a substrate, such as tungsten carbide-cobalt (WC—Co), which is coated with a diamond deposit having enhanced adherence wherein the coating is formed by combustion flame CVD wherein a deposition promoter is added to the flame.

A still further embodiment of the invention is directed to an article which comprises a substrate, such as WC—Co, which is coated with a diamond deposit having enhanced adherence wherein the coating is formed by combustion flame CVD wherein a high-temperature binder is added to the flame.

A yet still further embodiment on the invention is directed to articles which comprise substrates that have a diamond deposit which is both strongly adherent to the substrate surface and bonded to the substrate by the high-temperature binder.

Other embodiments and advantages of the invention are set forth in part in the following description, and in part, will be obvious from this description, or may be learned from the practice of the invention.

DESCRIPTION OF THE INVENTION

Figure 1:
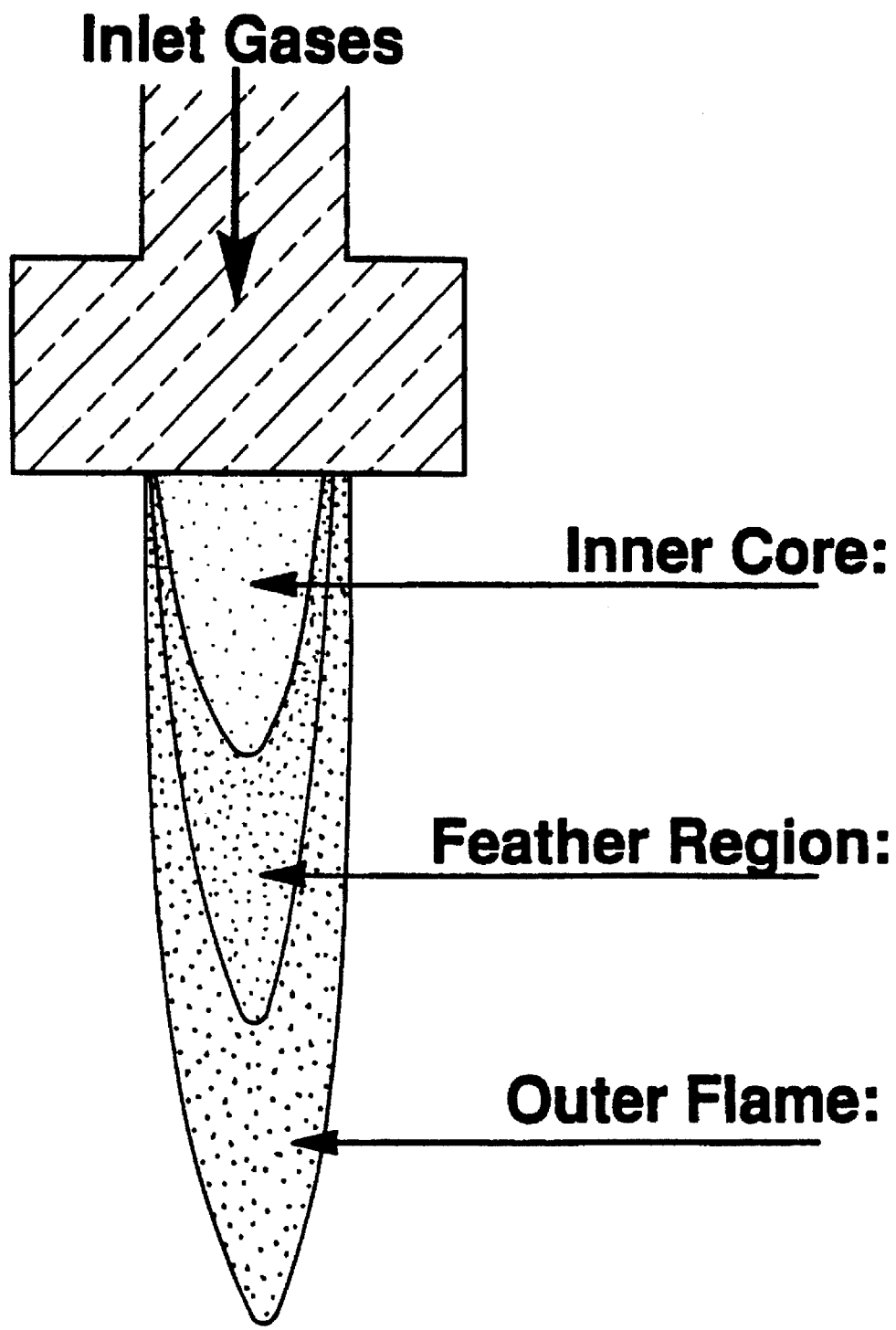
FIG. 1. Schematic depicting the three regions observed in an oxygen/acetylene flame, operated in a slightly $C_2H_2$ rich mode.

Diamond is one of the premier materials used for tribological applications. In most applications, especially tribological, good adherence of the coating to the substrate is one of the most critical requirements. For example, in cutting tools excellent adherence of diamond forms to substrates is absolutely required. While many conventional diamond synthesizing processes are useful, their commercial viability is some what restricted due to cost. It is therefore considered extremely desirable if an inexpensive technique, such as the flame CVD process, could be successfully developed to yield high quality, adherent coatings.

The present invention, as embodied and broadly described herein, comprises methods for the synthesis of diamond coatings on substrates by chemical vapor deposition (CVD) using deposition promoters and/or high temperature binders, and to the substrates coated by these methods.

CVD, and particularly flame CVD, is the cheapest and easiest process to commercialize among all known diamond growth techniques. For example, in combustion flame CVD, gases such as acetylene ($C_2H_2$), ethylene ($C_2H_4$), propane ($C_3H_8$), and the like, are combined with oxygen ($O_2$) at a nozzle and ignited to produce a flame. Within the flame extremely high temperatures (over 3000° C. for the oxygen/acetylene flame) can be attained. Growth rates of diamond coatings using an oxygen/acetylene mixture having been reported to be higher in comparison to other gases. Furthermore, the flame itself is used as the reaction chamber making the process relatively inexpensive. Precise control over the starting reagents can be achieved resulting in a higher quality product.

One embodiment of the invention is directed to a method for the synthesis of a diamond film, or coating, on a substrate having enhanced adherence to the substrate using combustion flame CVD. In combustion flame CVD, a flame is created from a hydrocarbon source, which may be a saturated hydrocarbon such as methane, ethane, propane, butane, or pentane, an unsaturated hydrocarbon such as ethene, propene, butene, pentene, ethyene, propene, butadiene, cyclopentene, methylene, ethylene, propylene, butylene, acetylene, or arylene, an unsubstituted compound such as isobutane, isopentane, neopentane, isohexane, trimethylene, or isobutylene, or an aromatic compound such as benzene, toluene, xylene, or cyclohexane. The flame may additionally require an oxygen source which is preferably oxygen gas or air, but may be an alternative form of oxygen such as oxygen which is integral to the hydrocarbon source. The flow of hydrocarbon, and, if necessary, oxygen, are each adjustable, combine and emerge at a single port where the sources are ignited forming a flame. The size and temperature of the flame are adjusted by increasing or decreasing the flow rates of the sources using, for example, mass flow controllers. Alternatively, the flame size could also be adjusted by changing the exit port such as by changing the size or the flow dynamics of the nozzle.

The combustion flame comprises three regions, the outer flame region, the feather region and the inner core region. The temperature of the flame at the point of diamond deposition is very high. In the oxygen/acetylene flame this temperature is generally in the range of about 3000° C to about 3500° C., preferably in excess of 3200° C. The inner core is the area of complete combustion where the hydrocarbon and, if necessary, the oxygen gasses are heated to ignition temperatures. The feather region, which appears when excess hydrocarbon is applied to the flame, is the area of incomplete combustion and the area in which diamond formation takes place. The length of the feather region is sensitive to the gas mixture ratio (R), as is the volume of the feather region which is controlled by adjusting the amount of oxygen added to the flame. The outer core is where carbon monoxide (CO) and the product in the inner core are converted into water ($H_2O$) and carbon dioxide ($CO_2$).

The flame can be created in nearly any atmosphere including argon or other noble gasses, such as neon, krypton, xenon, or radon, or in the open air by adjusting the amount of oxygen supplied to the flame. Deposition zones are generally circular with sizes that can be varied by varying the size of the feather region of the flame by, for example, altering the flow and/or absolute amount of the hydrocarbon or altering the size of the output nozzle. Deposition zone size can be varied using different nozzle designs or multiple nozzles to provide greater coverage over a substrate. In the preferred embodiment the flame is an oxygen/acetylene torch. Flow rates of oxygen and acetylene, which are generally between about one to about two standard liters per minute (SLM), depend on the size of the desired flame and the volume ratio of oxygen to acetylene ($R=O_2/C_2H_2$), which is preferably greater than about 1.0 and more preferably greater than about 1.10. The useful range for diamond growth is dependent upon such parameters as ambient room conditions including temperature, pressure, and humidity. For example, as air temperature or humidity increase, the amount of oxygen in the air decreases and more oxygen would have to be supplied to create the same flame. In a similar manner, at increased pressure, there is an increased amount of oxygen and a correspondingly lesser amount of oxygen would be needed by the flame.

To the flame is added a deposition promoter which alters the conventional deposition process and surprisingly results in a diamond coating with enhanced adherence. The amount deposition promoter added to the flame is much smaller than the amount of gasses and is typically around 15 ml per hour with flow rates of around 1–2 SlAM. Increased temperatures within the flame alters the temperature of the flame's feather region and, it is believed, allows for the more complete ionization of precursor carbon molecules which evenly and uniformly form the $sp^3$ tetrahedrally coordinated carbon lattice on the substrate. The presence of the deposition promoter also causes diamond deposition to occurs at oxygen to hydrocarbon ratios (R) of greater than or equal to 1.0, preferably between about 1.0 to about 1.2, and more preferably between about 1.05 to about 1.16. The ratio at the inner core region and the feather region is maintained at about 1:4. This allows for increased numbers of pre-diamond carbon atoms to form thereby increasing the rate of diamond deposition. This reduces deposition times and rapidly produces a diamond or diamond-like coating with enhanced adherence. Deposition occurs at greater than 30 µm per hour, preferably at greater than 50 µm per hour, more preferably at greater than about 60 µm per hour, still more preferably at greater than about 100 µm per hour, and yet still more preferably at greater than about 130 µm per hour. Coating thickness is variable and typically depends upon the use to which the coated article is to applied. For cutting tools thickness is generally between about 5 µm to about 20 µm.

Useful deposition promoters are alcohols, aldehydes, acids such as carboxylic acids and carboxylic acid esters, ethers, alkanes, aromatics, ketones such as acetone, and esters. Preferably the deposition promoter is an alcohol which may be a monohydric, dihydric, trihydric, or polyhydric alcohol. More preferably the alcohol is methanol, propanol, or butanol, and still more preferably the alcohol is ethanol. The deposition promoter is preferably a liquid and one or more promoters may be introduced to the flame together. The deposition promoter may be directly added to the flame at the torch or carried to the flame by one of the sources such as, for example, by aspiration. When the promoter is ethanol and the flame is an acetylene torch, the oxygen to hydrocarbon ratio (R) is about 1.13.

Alternatively, and/or in addition to the deposition promoter, a high temperature binder may be added to the flame which integrates with and forms a cementous layer on the substrate into which the pre-diamond, carbon molecules deposit. The resulting diamond containing coating has increased adherence due to he cementous component. Binders that are useful in this regard are refractory metals such as nickel (Ni), chromium (Cr), tungsten (W), titanium (Ti), molybdenum (Mo), niobium (Nb), tantalum (Ta), vandium (V), iron(Fe), and cobalt (Co). Useful refractory metal compounds include nickelhexamine chlorate $[(Ni(NH_3)6)(ClO_3)_2]$, titanium tetrabromide ($TiBr_4$), cobalt II bromide ($CoBr_2$), tungsten tetrabromide ($WBr_5$), molybdenum dichloride ($MoCl_2$), vandium tribromide ($VBr_3$), chromium III bromide ($CrBr_3$), niobium pentachloride ($NbCl_5$), and tantalum bromide ($TaBr_5$). Useful organometallic compounds may comprise any of the aforesaid metals. Preferably the organometallic compounds are cyclohexadiene iron tricarbonyl ($C_6H_8Fe(CO)_3$), iron pentacarbonyl ($Fe(CO)_5$), nickel 2-ethylhexanote $[Ni(OOCCH(C_2H_5)C_4H_9)_2]$, titanium ethoxide ($Ti(OC_2H_5)_4$), cyclopentadienyl cobalt dicarbonyl ($C_5H_5Co(CO)_2$), mesitylene tungsten tricarbonyl ($C_9H_{12}W(CO)_3$), cycloheptatriene molybdenum tricarbonyl ($C_7H_8Mo(CO)_3$), vandium tri-I-proxy oxide ($VO(C_3H_7)_3$), tris (2,2,6,6-tetramethyl-3,5-heptanedionato)chromium(111)($Cr(C_{11}H_{19}O_2)_3$), niobium ethoxide ($Nb(OC_2H_5)_5$), and tantalium V ethoxide $Ta(OC_2H_5)_5$). The binder is preferably a liquid and one or more binders may be introduced to the flame together. The binder may be directly added to the flame at the torch or carried to the flame by one of the sources such as, for example, by aspiration.

Substrates to be coated with diamond are placed into the feather region. Substrates which can be coated include those compounds which are able to withstand the high temperatures of the procedure. Useful substrates include high temperature stable metals, alloys, ceramics, carbides, nitrides, and cermets, including substrates comprising copper(Cu), molybdenum(Mo), silicon(Si), such as silicon used in silicon wafers, silicon nitride($Si_3N_4$), and silicon carbide(SiC), boron nitride(BN), titatium(Ti), titanium carbide (TiC), titanium nitride (TiN), tungsten (W), tungsten carbide (WC), and, preferably, tungsten carbide-cobalt (WC—Co). If desired, substrate surfaces may be polished using, for example, diamond paste prior to CVD. Alternatively, the surface may be pre-seeded with diamond particles to foster particle development, although this can sometimes lead to particle clumping. Nucleation rates, if desired, can be increased by using, for example, diamond-like materials as substrates. The substrate may also be coated with an interface layer such as titanium carbide which can eliminate excessive diffusion, has good adherence to the substrate, and produces good grain size, prior to deposition of the diamond layer.

The surface temperature of the substrate is important in diamond formation and is in the range of 300° C. to 1,200° C., preferably between about 400° C. to about 1,000° C., and more preferably between about 500° C. to about 650° C. when the substrate is WC—Co. The temperature of the substrate is maintained by a controlling apparatus which circulates a cooling fluid which may be a gas or a liquid such as water. Preferably the cooling apparatus is a water cooled copper block. Substrate temperature is also adjusted by changing the distance between the substrate to the cooling apparatus. Substrate temperature is measured by a temperature sensing devise such as an optical pyrometer or a chrome-alumel thermocouple which may be directly attached to the substrate. Additionally, depending on the temperature of the substrate, considerable flexibility in terms of controlling the grain size and crystal morphology of the coatings is available. This allows for the tailoring of coating properties and procedures to fit particular uses.

In most uses of coated substrates, including tribological, surface properties of the coating govern the performance of the article. One consideration is that there be adequate adhesion for the particular use to which the article is to be applied. Adhesion is a macroscopic property that depends on the chemical and mechanical bonding across the interfacial region, the intrinsic stress and stress gradient, and the stress to failure or the failure mode. Coating adhesion is measured by an adhesion test such as a peel test, a pull test, scratch test, a micro-scratch test, or a load or indentation test. One of the more reliable tests is the scratch test, first described by P. Benjamin and C. Weaver (Proc. R. Soc. A 254:163, 1960) and later by P. J. Burnett and D. S. Rickerby (Thin Solid Films 154: 415, 1987), which are both hereby specifically incorporated by reference. In the scratch test, progressively increasing loads are applied to an indentor placed on the coated substrate. Optimization of indenter shape, size, geometry, and loading configurations can be developed through the boundary integral method, the numerical simulation model, or another method which is known to those of ordinary skill in the art. Loads are detected by, for example, an acoustic emission detector to determine critical load ($L_c$) to failure which is typically measured in Newtons (N). The conventional process only yields diamond coatings with critical loads of around 2N. Using the method of the invention, critical loads of greater than 2N, preferably greater than 5N, more preferably greater than 25N, and still more preferably greater than 50N are achievable. Adhesion strength of the coatings also can be measured by an indentation test. A diamond tipped cone is applied to the surface of the coated substrate. Loads are increased until evidence of coating strength can be observed. Loads of between about 5–10 kg are sufficient to cause cracking and flaking of coating applied by the conventional coating process. In contrast, coatings applied by the method of the invention show no evidence of failure at loads of about 15 kg, and are preferably still intact at loads greater than about 30 kg, and more preferably at loads greater than about 60 kg.

Coating structure and morphology can be viewed and analyzed by optical microscopy, transmission electron microscopy(TEM), scanning electron microscopy(SEM), scanning tunneling microscopy (STM), X-ray diffraction, electron channeling, Raman and Micro-Raman spectroscopy, or Auger spectra analysis. Microscopy provides a view of the size, crystal structure, nucleation, and overall morphology of the diamond coating. Under microscopy it is observed that diamond coatings formed by the method of the invention have deposit centers containing diamond grains with triangular faced, faceted crystals that are surprisingly uniform. It is believed that uniformity provides a significant advancement over the conventional process because heat distribution across the substrate is more controlled which provides for a stronger and more stable interaction of carbon atoms across the surface. Coatings are thinner at the peripheries of the circular center zones with an average grain size smaller then grains formed at the coatings. Growth centers are highly textured comprising crystals of various shapes and designs with a minimum number of secondary growth facets and an absence of voids or spaces. This produces a superior coated substrate with enhanced wear resistance, hardness, and strength.

X-ray diffraction, Raman spectroscopy, Rutherford backscanning analysis, and Augur analysis provides a more detailed view of the atomic binding which has occurred and gives an understanding of the chemical interactions between and within the diamond molecules. Raman spectroscopy indicates that diamond coatings prepared by the method of the invention have peak wave numbers very near 1330 cm$^{-1}$, characteristic of the sp$^3$ carbons of diamond. Coatings show a preferred orientation with texturing and few contaminants.

After the diamond film has been deposited on the substrate, the crystals or the entire film may be subjected to further manipulation. For example, CVD diamond crystals can be shaped by etching with molten rare-earth metals such is, for example, cerium (Ce) or lanthanum (La), as described by S. Jin et at. (Nature 362:822–24, 1993), which is hereby specifically incorporated by reference. Other methods of diamond etching include wet etching using chemicals such as aqua regia and the like. Alternatively, diamond films may be polished, thinned, or shaped as desired in the final product. These processes may be performed simultaneously or sequentially with the method of the invention.

The following examples are offered to illustrate embodiments of the present invention, but should not be viewed as limiting the scope of the invention.

EXAMPLES

Example 1

Diamond Deposition Comparison of Process I and Process II

A torch fitted with a 0.72 mm orifice welding tip was utilized for most experimental deposition studies (depicted in FIG. 1). Commercially available WC—Co or Si$_3$N$_4$ were used as substrate materials. Deposition zones of 4 mm are typical with WC—Co and Si$_3$N$_4$ substrate. The substrate was inserted into a water cooled copper block to control its temperature during the coating process. Temperature was measured with an a chromaalumel thermocouple inserted through a hole in the substrate sample. Substrate temperature was varied by adjusting the distance between the sample and water cooled copper block and was maintained in the 530° to 700° C. range. High purity oxygen and acetylene were used as the reactants and their flow rates through the torch were controlled with mass flow controllers at about 1–2 SLM to an accuracy of less than 2% full scale. Diamond coatings, typically 10 µm thick, were deposited using two different techniques. The first technique, Process I, is the conventional process. The ratio of gasses supplied to the combustion flame (O$_2$/C$_2$H$_2$) was maintained at about 1.0 with the acetylene flow ate at about 0.8 SLM. The second technique, the process of the invention or Process II, uses a gas volume ratio (R) of greater than or equal to about one. Identical experiments were conducted using Process I, without ethanol, and Process II in the presence of ethanol which was delivered to the flame at about 15 ml per hour by aspiration with the oxygen gas. Using Process I diamond deposition only occurred at volumetric ratios (R) of around 1.0. At an R value of 1.13, no diamond deposition was observed on the substrate. In contrast, using Process II, the reverse was true. There was significant diamond deposition at R values of around 1.13 and none at an R value of 1.0. The length ratio maintained between the inner core and the feather region was maintained at about one to four.

Example 2

Scratch Test Comparison of Diamond Films Made by Processes I and II

Figure 2A:
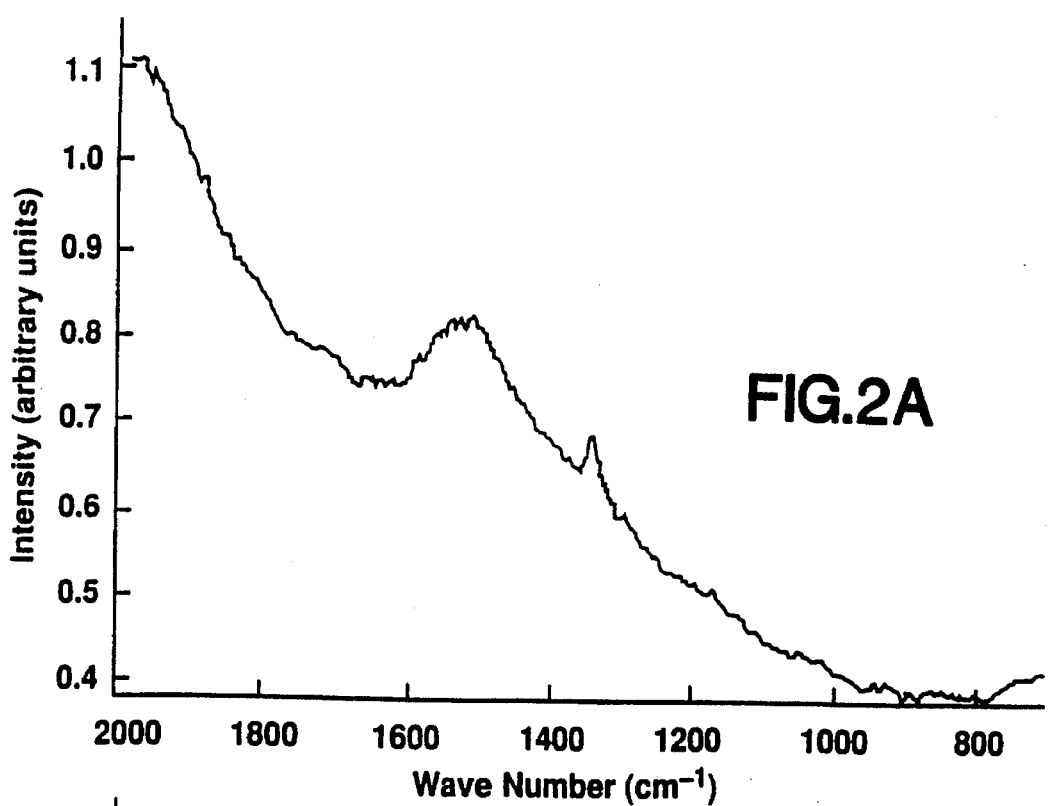
FIG. 2. Raman Spectra of diamond coatings on WC—Co substrates produced by Process I (curve I; the conventional process), and Process II (curve H; the process of the invention).
Figure 2B:
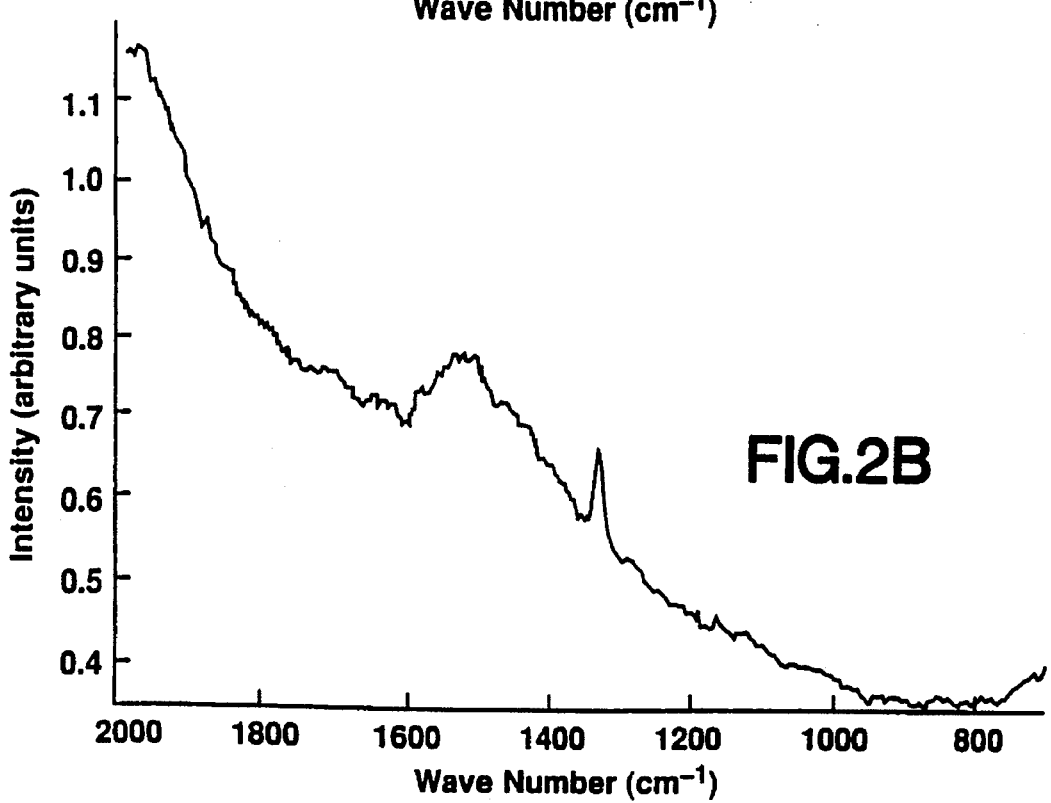
Figure 3:
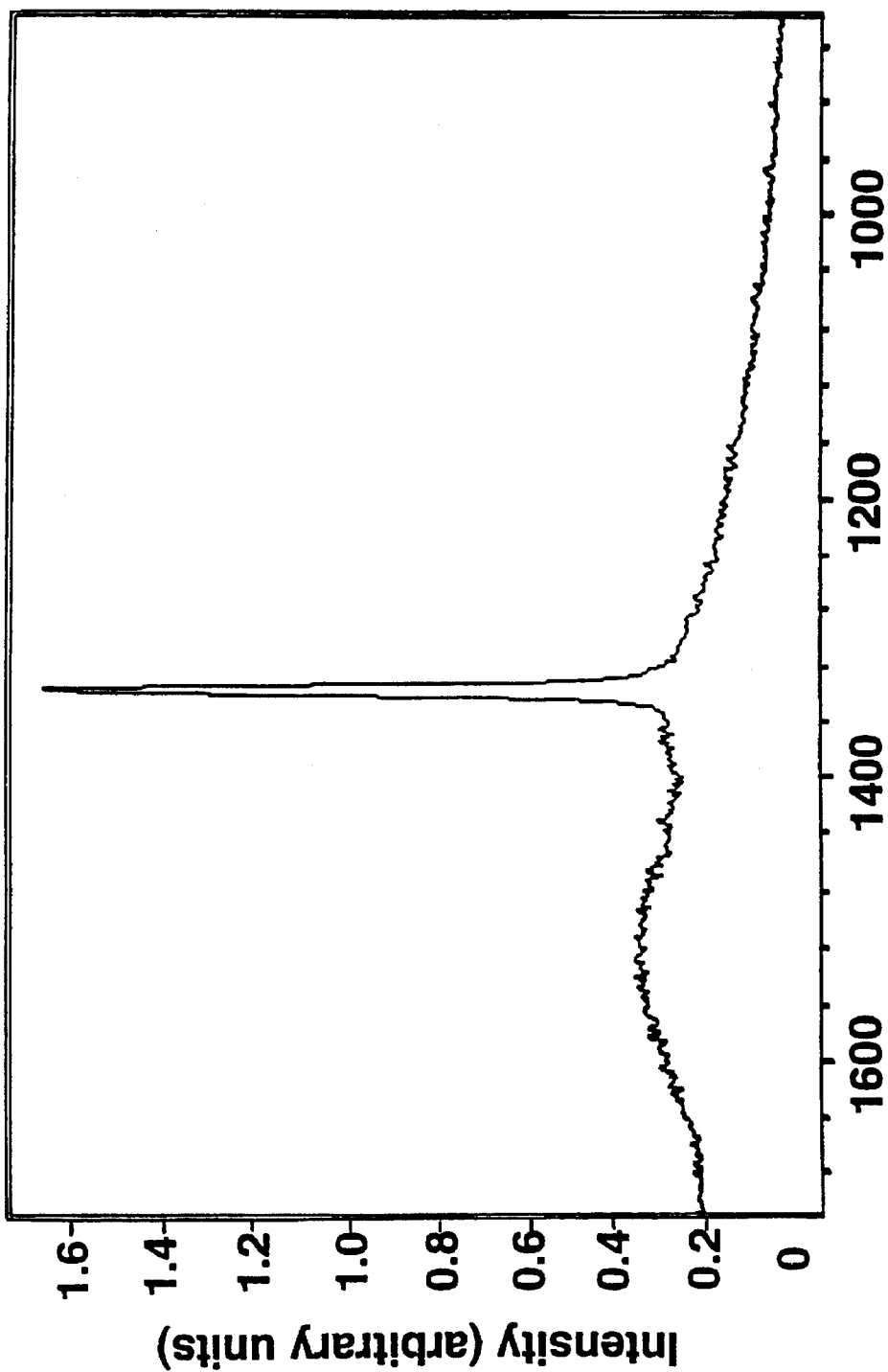
FIG. 3. Raman Spectra of diamond coatings on $Si_3N_4$ substrates produced by the optimized method of Process II.

A series of experiments were carded out to deposit diamond coatings on various WC—Co and Si$_3$N$_4$ substrates using the method of Process I or Process II. These substrates were then characterized using the SEM and Raman spectroscopy, and their adhesion was evaluated by a scratch test. The shape of the deposits conformed with the circular nature of the flame. The Raman spectra taken at the center of the deposits for films grown by Process I and II on Si$_3$N$_4$ substrates is depicted in FIG. 2. Both spectra show a clear and sharp peak at a wave number around 1330 cm$^{-1}$ which is characteristic of a diamond structure. However, peak broadening observed between 1400 and 1600 cm$^{-1}$ suggests that some non-diamond material is also present in these films. When Process II is optimized, the non-diamond material is eliminated and there is a single very clear and distinct peak at around 1330 cm$^{-1}$ (FIG. 3).

Example 3

Photomicrograph Comparison of Diamond Films Made by Processes I and II

Figure 4A:
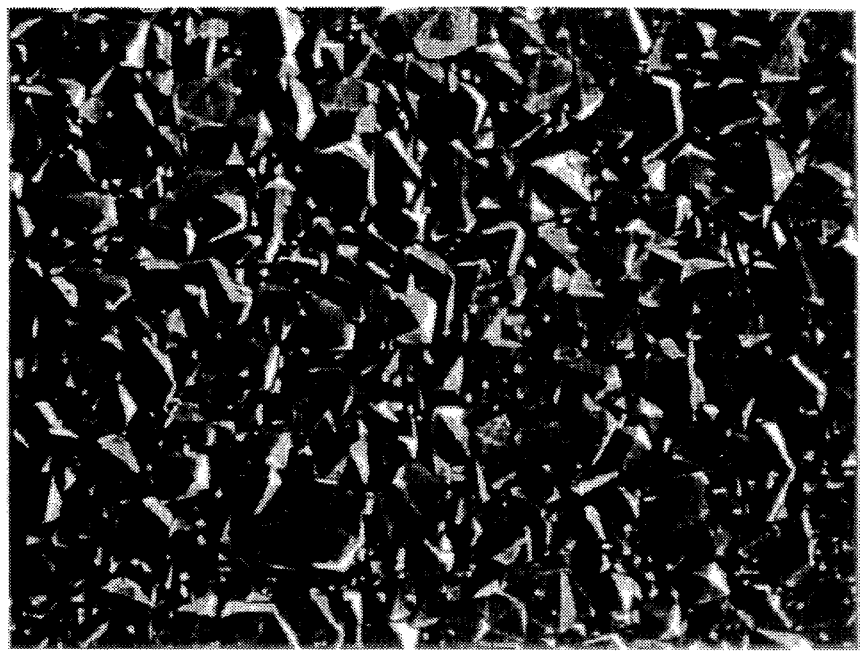
FIG. 4. SEM photomicrographs showing typical morphology in the center and on th outer edge of the coating obtained using Process I.
Figure 4B:
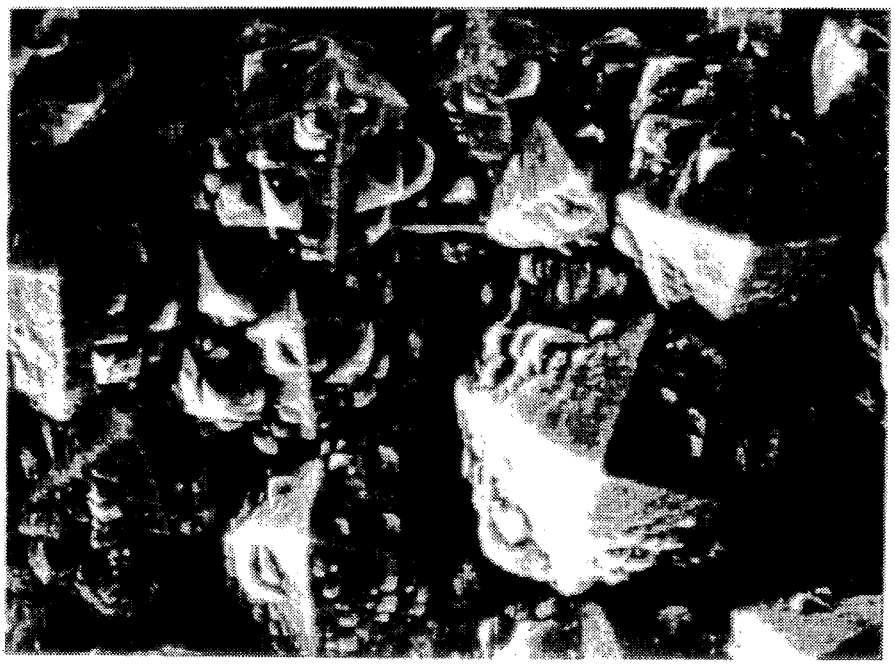

SEM photomicrographs were taken of diamond-coated substrates prepared using the oxygen/acetylene (O$_2$/C$_2$H$_2$) flame and either Process I or Process II. Typical morphologies of diamond deposits prepared according to Process I, the conventional process, are shown in FIG. 4. The center of the deposit was observed to be composed of highly crystalline diamond grains of various shapes with a minimal amount of secondary growth facets. The size of these individual grains, and therefore the roughness of the deposit, varied significantly from spot to spot. On the edge of the deposited circle, the amount of secondary growth facets drastically increased and the coating contained a large numbers of voids among the grains. Outside the edge of the deposited circle the morphology of the coating became non-uniform and cauliflower-like. Process I resulted in coatings with significantly large variations in the morphology from the center to the outer part of the circular deposited zone. Additionally, varying amounts of secondary facet growth were also observed.

Figure 5A:
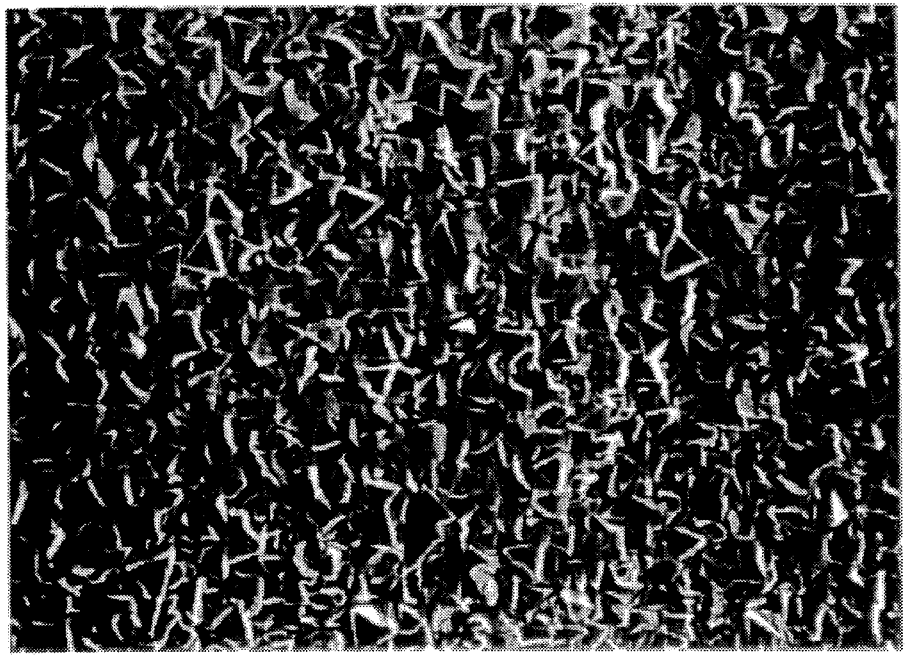
FIG. 5. SEM photomicrographs showing typical morphology in the center and on the outer edge of the coating using Process II.
Figure 5B:
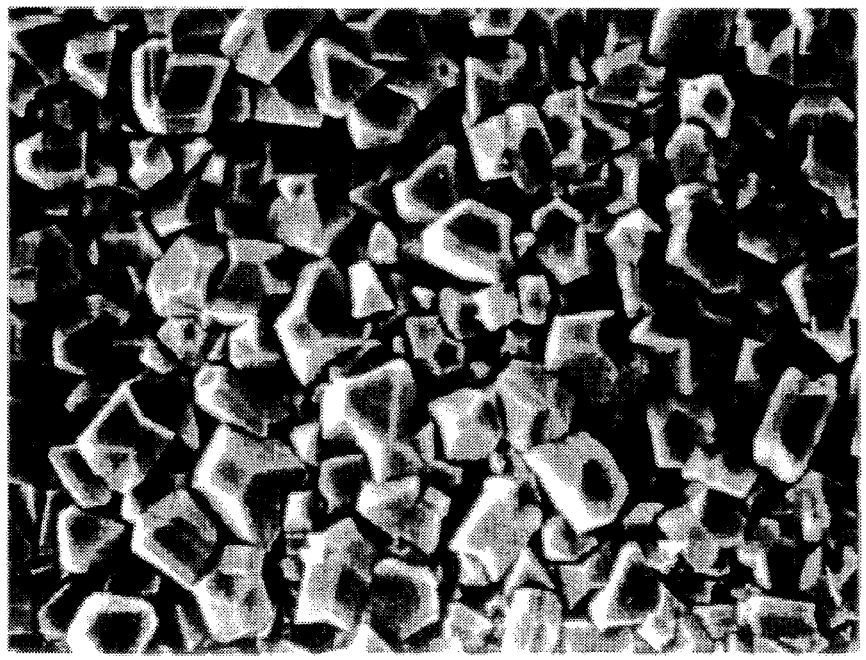

Typical SEM photomicrographs of diamond deposits prepared using the method of Process II and taken at various locations are shown in FIG. 5. Process II yielded circular coating diameters of about 4 mm and thicknesses which were lower at the periphery of the zone. The center of the deposited was found to be comprise of diamond grains with triangular faceted crystals resulting in highly textured coatings with a (111) orientation. The sizes of the individual particles, unlike in the conventional process, were found to be extremely uniform. On the outer edge of the deposit the average grain size was smaller than that in the center. Outside of the edges of the flame's circular deposited zone some randomly distributed diamond particles were also observed.

Example 4

Load Test Comparison of Films Made by Processes I and II

Figure 6:
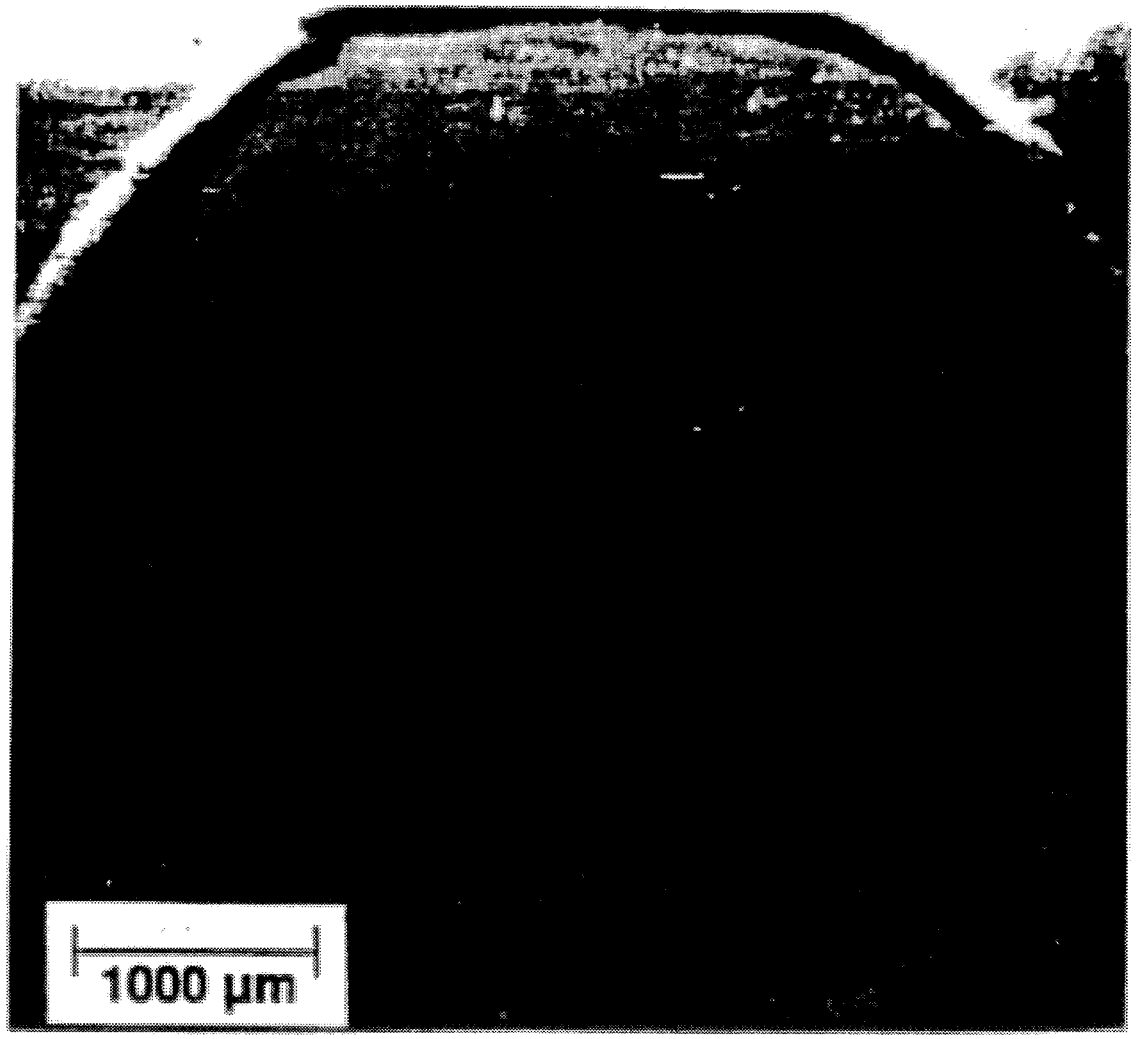
FIG. 6. Photomicrograph showing almost complete removal of the deposit (light area) at contact (2N) of the indenter to the sample coated by Process I.
Figure 7A:
FIG. 7. (a) Initiation of scratch scar, and (b) eventual failure of the coating at 52N deposited by Process II. Arrow indicates direction of scratching.
Figure 7B:

Coating adhesion was tested by a scratch test with progressively increasing loads using an acoustic emission detector to determine critical load (L$_c$) to failure. For these tests, a Rockwell diamond tip with a 120° cone angle, and a 200 µm tip radius was used. Samples were scratched at a speed of 1 cm/min. Several samples were tested for adhesion strength to obtain statistically valid data. Diamond films deposited using the conventional process (Process I) peeled off the substrate at a critical load around 2N. In other words, almost total removal of the deposit was observed by merely loading the sample with the indenter (FIG. 6). In contrast, the critical load of coating deposited using Process II was found to be in the 52–57N range (FIGS. 7a,b).

Example 5

Adhesion Test Comparison of Films Made by Processes I and II

Figure 8A:
FIG. 8. Adhesion strengths of substrates coated with diamond using the method of Process I and Process II.
Figure 8B:
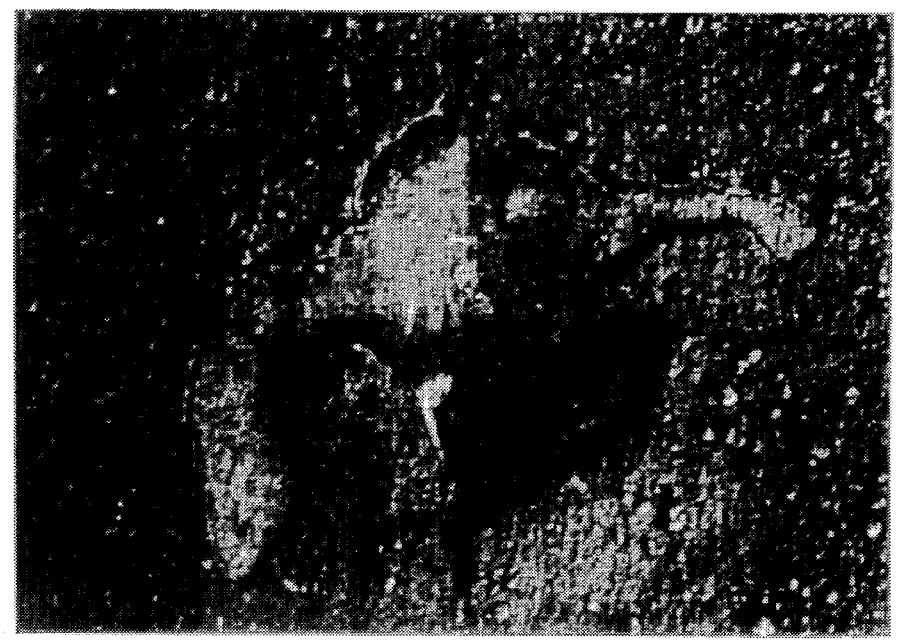

Adhesion strength of diamond coated substrates was tested by indentation with a Rockwell diamond cone at applied loads in the 5 to 60 Kg range FIG. 8). The diamond coatings deposited using Process I flaked off the substrate at the lowest applied load (5–15 Kg), whereas coatings obtained via the modified Process II remained intact even at the highest applied loads (60 Kg). Cracks were observed in the indentation region, their length, size and shape depended on the applied load. These results indicate that coatings deposited by Process II are highly adherent and far superior to those obtained from he conventional oxygen/acetylene flame process, Process I.

Example 6

Increasing Deposition Zone Size Using the Method of Process II

To increase the area of the deposited zone a torch with a wider orifice (1.15– 1.85 mm) was utilized. The flow rate of oxygen ($O_2$) and acetylene ($C_2H_2$) were increased accordingly with the orifice size of the torch. The resultant diamond coatings on WC—Co were also tested for adhesion characteristics. Similar results were achieved, indicating that large areas can be coated with uniform morphology and still have excellent adherence using the modified process.

Other embodiments or uses of the invention will be apparent to those skilled in the art from consideration of the specification and practice of the invention disclosed therein. It is intended that the specification and examples be considered exemplary only, with the true scope and spirit of the invention being indicated by the following claims.

We claim:

1. A crystalline diamond coated substrate wherein a coating is deposited on the substrate by establishing a flow of oxygen and acetylene to a combustion device at a volumetric flow ratio ($R=O_2/C_2H_2$) of greater than or equal to about 1.0; creating a flame in the combustion device, wherein the flame comprises an inner core region, an acetylene feather region, and an outer region; positioning the substrate, which is maintained at a temperature of between about 300° C. to about 1200° C., in the acetylene feather region; adding to the flame a deposition promoter to favor the growth of a strongly adherent, uniform layer of crystalline diamond particles on the substrate, wherein the deposition promoter is selected from the group consisting of carboxylic acids, alcohols, aldehydes, ketones, ethers and carboxylic acid esters; and depositing the strongly adherent, uniform layer of crystalline diamond particles of substantially uniform size and shape on the substrate.

2. The article of claim 1 wherein said substrate comprises copper, molybdenum, silicon, silicon nitride, silicon carbide, boron nitride, titanium, titanium carbide, titanium nitride, tungsten, tungsten carbide, or tungsten carbide-cobalt.

3. The article of claim 1 which is an abrasive, a grinding tool, a cutting tool, a wear resistant instrument, an optical device, a medical device, an electrical conductor, a sliding device, or a wafer.

4. A crystalline diamond-coated substrate wherein a coating is deposited on the substrate by establishing a flow of oxygen and acetylene to a combustion device at a volumetric flow ratio ($R=O_2/C_2H_2$) of greater than or equal to about 1.0; creating a flame in the combustion device, wherein the flame comprises an inner core region, an acetylene feather region, and an outer region; positioning the substrate, which is maintained at a temperature of between about 300° C. to about 1200° C., in the acetylene feather region; adding to the flame a high-temperature binder which is a refractory metal or an organometallic compound; and depositing the layer of crystalline diamond particles on the substrate which is bonded to the substrate by the high-temperature binder.

5. The article of claim 4 wherein said substrate comprises copper, molybdenum, silicon, silicon nitride, silicon carbide, boron nitride, titanium., titanium carbide, titanium nitride, tungsten, tungsten carbide, or tungsten carbide-cobalt.

6. The article of claim 4 which is an abrasive, a grinding tool, a cutting tool, a wear resistant instrument, an optical device, a medical device, an electrical conductor, a sliding device, or a wafer.

7. The crystalline diamond coated substrate of claim 1 wherein the flame is created by an oxygen/acetylene torch.

8. The crystalline diamond coated substrate of claim 1 wherein R is between about 1.0 to about 1.2.

9. The crystalline diamond coated substrate of claim 1 wherein R is between about 1.05 to about 1.16.

10. The crystalline diamond coated substrate of claim 1 wherein the alcohol is selected from the group consisting of methanol, ethanol, propanol, isopropanol, butanol, and isobutanol.

11. The crystalline diamond coated substrate of claim 1 wherein the substrate is maintained at a temperature of between about 530° C. to about 650° C.

12. The crystalline diamond coated substrate of claim 1 wherein the diamond deposit forms at greater than about 30 μm per hour.

13. The crystalline diamond coated substrate of claim 1 wherein the diamond deposit as measured by a load test is greater than about 50N (Newtons).

14. The crystalline diamond coated substrate of claim 4 wherein the combustion flame is created by and oxygen/acetylene torch.

15. The crystalline diamond coated substrate of claim 4 wherein R is between about 1.0 about 1.2.

16. The crystalline diamond coated substrate of claim 4 wherein the high-temperature binder is the refractory metal compound selected from the group consisting of nickelhexamine chlorate, titanium tetrabromide, cobalt II bromide, tungsten tetrabromide, molybdenum dichloride, vanadium tribromide, chromium III bromide, niobium pentachloride, and tantalum bromide.

17. The crystalline diamond coated substrate of claim 4 wherein the high-temperature binder is the organometallic compound selected from the group consisting of cyclohexadiene iron tricarbonyl, iron pentacarbonyl, nickel 2-ethylhexanote, titanium ethoxide, cyclopentadienyl cobalt dicarbonyl, mesitylene tungsten tricarbonyl, cycloheptatriene molybdenum tricarbonyl, vanadium tri-I-proxy oxide, tris(2,2,6,6-tetramethyl-3,5-heptanedionato)chromium (111), niobium ethoxide, and tantalum V ethoxide.

18. The crystalline diamond coated substrate of claim 4 wherein the substrate is maintained at a temperature of between about 530° C. to about 650° C.

19. The crystalline diamond coated substrate of claim 4 wherein the diamond deposit as measured by a load test is greater than about 50N (Newtons).

* * * * *